United States Patent [19]
Henley et al.

[11] Patent Number: 6,146,979
[45] Date of Patent: Nov. 14, 2000

[54] PRESSURIZED MICROBUBBLE THIN FILM SEPARATION PROCESS USING A REUSABLE SUBSTRATE

[75] Inventors: Francois J. Henley, Los Gatos; Nathan W. Cheung, Albany, both of Calif.

[73] Assignee: Silicon Genesis Corporation, Campbell, Calif.

[21] Appl. No.: 09/026,032

[22] Filed: Feb. 19, 1998

Related U.S. Application Data

[60] Provisional application No. 60/046,276, May 12, 1997.

[51] Int. Cl.⁷ .................................................. H01L 21/30
[52] U.S. Cl. .......................................... 438/458; 438/455
[58] Field of Search .................................. 438/455, 458, 438/464

[56] References Cited

U.S. PATENT DOCUMENTS

| | | | |
|---|---|---|---|
| 2,614,055 | 10/1952 | Senarelens | 241/4 |
| 3,117,022 | 1/1964 | Bronson et al. | 427/526 |
| 3,225,820 | 12/1965 | Riordan | 165/96 |
| 3,551,213 | 12/1970 | Boyle | 438/515 |
| 3,770,499 | 11/1973 | Crowe et al. | |
| 3,786,359 | 1/1974 | King | 315/500 |
| 3,806,380 | 4/1974 | Kitada et al. | 148/239 |
| 3,832,219 | 8/1974 | Nelson et al. | 427/528 |
| 3,900,636 | 8/1975 | Curry et al. | 427/526 |
| 3,915,757 | 10/1975 | Engel | 148/278 |
| 3,957,107 | 5/1976 | Altoz et al. | 165/276 |
| 3,993,909 | 11/1976 | Drews et al. | 250/492.2 |
| 4,006,340 | 2/1977 | Gorinas | 219/121.47 |
| 4,039,416 | 8/1977 | White | 427/523 |
| 4,074,139 | 2/1978 | Pankove | 250/492.2 |
| 4,107,350 | 8/1978 | Berg et al. | 427/474 |
| 4,108,751 | 8/1978 | King | 204/192.11 |
| 4,116,751 | 9/1978 | Zaromb | 117/89 |
| 4,121,334 | 10/1978 | Wallis | 438/51 |
| 4,170,662 | 10/1979 | Weiss et al. | 264/520 |
| 4,252,837 | 2/1981 | Auton | 427/576 |
| 4,274,004 | 6/1981 | Kanai | 250/442.11 |
| 4,342,631 | 8/1982 | White et al. | 427/524 |
| 4,346,123 | 8/1982 | Kaufmann | 427/580 |
| 4,361,600 | 11/1982 | Brown | 438/410 |
| 4,368,083 | 1/1983 | Bruel et al. | 438/536 |
| 4,412,868 | 11/1983 | Brown et al. | 438/423 |
| 4,452,644 | 6/1984 | Bruel et al. | 438/336 |
| 4,468,309 | 8/1984 | White | 427/528 |
| 4,471,003 | 9/1984 | Cann | 427/452 |
| 4,486,247 | 12/1984 | Ecer et al. | 148/318 |

(List continued on next page.)

FOREIGN PATENT DOCUMENTS

| | | |
|---|---|---|
| 084 287 | 12/1982 | European Pat. Off. . |
| 099 778 | 6/1983 | European Pat. Off. . |
| 112 230 | 12/1983 | European Pat. Off. . |
| 112 238 | 12/1983 | European Pat. Off. . |

(List continued on next page.)

OTHER PUBLICATIONS

Choyke et al., "Mechanical Response of Single Crystal Si to Very High Fluence H+ Implantation," *Nuc. Instr. Meth.*, 209–210:407–412 (1983).

(List continued on next page.)

*Primary Examiner*—Carl Whitehead, Jr.
*Assistant Examiner*—Jeff Vockrodt
*Attorney, Agent, or Firm*—Townsend and Townsend and Crew LLP

[57] ABSTRACT

A technique for forming films of material (14) from a donor substrate (10). The technique has a step of introducing gas-forming particles (12) through a surface of a donor substrate (10) to a selected depth underneath the surface. The gas-forming particles form a layer of microbubbles within the substrate. A global heat treatment of the substrate then creates a pressure effect to separate a thin film of material from the substrate. Additional gas-forming particles are introduced into the donor substrate and a second thin film of material is then separated from the donor substrate. In a specific embodiment, the gas-forming particles are implanted using a plasma immersion ion implantation method.

10 Claims, 5 Drawing Sheets

U.S. PATENT DOCUMENTS

| | | | |
|---|---|---|---|
| 4,490,190 | 12/1984 | Speri | 148/222 |
| 4,500,563 | 2/1985 | Ellenberger et al. | 438/710 |
| 4,508,056 | 4/1985 | Bruel et al. | 118/730 |
| 4,536,657 | 8/1985 | Bruel | 250/492.2 |
| 4,566,403 | 1/1986 | Fournier | 118/718 |
| 4,567,505 | 1/1986 | Pease et al. | 257/713 |
| 4,568,563 | 2/1986 | Jackson et al. | 427/538 |
| 4,585,945 | 4/1986 | Bruel et al. | 250/492.2 |
| 4,684,535 | 8/1987 | Heinecke et al. | 427/491 |
| 4,704,302 | 11/1987 | Bruel et al. | 438/585 |
| 4,717,683 | 1/1988 | Parrillo et al. | 438/451 |
| 4,727,047 | 2/1988 | Bozler | 438/464 |
| 4,764,394 | 8/1988 | Conrad | 427/525 |
| 4,837,172 | 6/1989 | Mizuno et al. | 438/475 |
| 4,846,928 | 7/1989 | Dolins et al. | 438/16 |
| 4,847,792 | 7/1989 | Barna et al. | 702/182 |
| 4,853,250 | 8/1989 | Boulos et al. | 36/28 |
| 4,883,561 | 11/1989 | Gmitter et al. | 438/27 |
| 4,887,005 | 12/1989 | Rough et al. | 427/446 |
| 4,894,709 | 1/1990 | Phillips et al. | 315/111.21 |
| 4,931,405 | 6/1990 | Kamijo et al. | 257/714 |
| 4,948,458 | 8/1990 | Ogle | 438/143 |
| 4,952,273 | 8/1990 | Popov | 438/729 |
| 4,960,073 | 10/1990 | Suzuki et al. | 118/723 MR |
| 4,982,090 | 1/1991 | Wittmaack | 250/309 |
| 4,996,077 | 2/1991 | Moslehi et al. | 427/562 |
| 5,015,353 | 5/1991 | Hubler et al. | 427/527 |
| 5,034,343 | 7/1991 | Rouse et al. | 438/400 |
| 5,070,040 | 12/1991 | Pankove | 438/106 |
| 5,082,793 | 1/1992 | Li | 438/423 |
| 5,110,748 | 5/1992 | Sarma | 438/30 |
| 5,133,826 | 7/1992 | Dandl | 156/345 |
| 5,196,355 | 3/1993 | Wittkower | 438/766 |
| 5,198,371 | 3/1993 | Li | 438/475 |
| 5,202,095 | 4/1993 | Houchin et al. | 422/186 |
| 5,203,960 | 4/1993 | Dandl | 216/70 |
| 5,213,451 | 5/1993 | Frank et al. | 406/72 |
| 5,234,529 | 8/1993 | Johnson | 156/345 |
| 5,234,535 | 8/1993 | Beyer et al. | 438/459 |
| 5,242,861 | 9/1993 | Inaba | 438/627 |
| 5,250,328 | 10/1993 | Otto | 427/535 |
| 5,252,178 | 10/1993 | Moslehi | 134/1.1 |
| 5,269,880 | 12/1993 | Jolly et al. | 438/701 |
| 5,273,610 | 12/1993 | Thomas, III et al. | 156/345 |
| 5,304,509 | 4/1994 | Sopori | 438/58 |
| 5,342,472 | 8/1994 | Imahashi et al. | 156/345 |
| 5,354,381 | 10/1994 | Sheng | 118/723 |
| 5,363,603 | 11/1994 | Miller et al. | 451/40 |
| 5,368,710 | 11/1994 | Chen et al. | 204/192.32 |
| 5,370,765 | 12/1994 | Dandl | 216/69 |
| 5,374,564 | 12/1994 | Bruel | 438/455 |
| 5,376,560 | 12/1994 | Aronowitz et al. | 438/407 |
| 5,404,079 | 4/1995 | Ohkuni et al. | 315/111.81 |
| 5,405,480 | 4/1995 | Benzing et al. | 156/345 |
| 5,411,592 | 5/1995 | Ovshinsky et al. | 118/718 |
| 5,435,880 | 7/1995 | Minato et al. | 156/345 |
| 5,476,691 | 12/1995 | Komvopoulos et al. | 427/527 |
| 5,487,785 | 1/1996 | Horiike et al. | 118/723 E |
| 5,494,835 | 2/1996 | Bruel | 156/250 |
| 5,504,328 | 4/1996 | Bonser | 250/288 |
| 5,558,718 | 9/1996 | Leung | 118/723 E |
| 5,559,043 | 9/1996 | Bruel | 438/407 |
| 5,585,304 | 12/1996 | Hayashi et al. | 438/459 |
| 5,643,834 | 7/1997 | Harada et al. | |
| 5,653,811 | 8/1997 | Chan | 118/723 I |
| 5,705,421 | 1/1998 | Matsushita et al. | 438/459 |
| 5,710,057 | 1/1998 | Kenney | 438/406 |
| 5,714,395 | 2/1998 | Bruel | 438/528 |
| 5,804,086 | 9/1998 | Bruel | |
| 5,854,123 | 12/1998 | Sato et al. | 438/507 |
| 5,869,387 | 2/1999 | Sato et al. | 438/459 |
| 5,877,070 | 3/1999 | Goesele et al. | 438/458 |
| 5,882,987 | 3/1999 | Srikrishnan | 438/458 |
| 5,920,764 | 7/1999 | Hanson et al. | 438/4 |
| 5,953,622 | 9/1999 | Lee et al. | 438/458 |
| 5,966,620 | 10/1999 | Sakaguchi et al. | 438/455 |

FOREIGN PATENT DOCUMENTS

| | | |
|---|---|---|
| 155 875 | 2/1984 | European Pat. Off. . |
| 164 281 | 12/1985 | European Pat. Off. . |
| 181 249 | 6/1989 | European Pat. Off. . |
| 355 913 | 2/1990 | European Pat. Off. . |
| 379 828 | 8/1990 | European Pat. Off. . |
| 459 177 | 12/1991 | European Pat. Off. . |
| 504 714 | 9/1992 | European Pat. Off. . |
| 533 551 | 3/1993 | European Pat. Off. . |
| 665 588 | 2/1995 | European Pat. Off. . |
| 660 140 | 6/1995 | European Pat. Off. . |
| 665 587 | 8/1995 | European Pat. Off. . |
| 703 609 | 3/1996 | European Pat. Off. . |
| 763 849 | 3/1997 | European Pat. Off. . |
| 867 917 | 9/1998 | European Pat. Off. . |
| 867 921 | 9/1998 | European Pat. Off. . |
| 1558881 | 3/1968 | France . |
| 2261802 | 2/1974 | France . |
| 2235474 | 4/1974 | France . |
| 2298880 | 1/1975 | France . |
| 2266304 | 4/1975 | France . |
| 2519437 | 1/1982 | France . |
| 2529383 | 6/1982 | France . |
| 2537768 | 8/1982 | France . |
| 2537777 | 12/1982 | France . |
| 2715502 | 1/1984 | France . |
| 2560426 | 2/1984 | France . |
| 2563377 | 4/1984 | France . |
| 2575601 | 12/1984 | France . |
| 2681472 | 9/1991 | France . |
| 2714524 | 12/1993 | France . |
| 2715501 | 1/1994 | France . |
| 2715503 | 1/1994 | France . |
| 2720189 | 5/1994 | France . |
| 2725074 | 9/1994 | France . |
| 834363 | 3/1952 | Germany . |
| 60-235434 | 11/1958 | Japan . |
| 53-104156 | 9/1978 | Japan . |
| 58-144475 | 8/1983 | Japan . |
| 60-83591 | 10/1983 | Japan . |
| 59-19394 | 1/1984 | Japan . |
| 59-46750 | 3/1984 | Japan . |
| 59-54217 | 3/1984 | Japan . |
| 59-114744 | 7/1984 | Japan . |
| 59-139539 | 8/1984 | Japan . |
| 60-207237 | 10/1985 | Japan . |
| 4-76503 | 7/1990 | Japan . |
| 4-246594 | 9/1992 | Japan . |
| 5-211128 | 8/1993 | Japan . |
| 7-215800 | 8/1995 | Japan . |
| 7-254690 | 10/1995 | Japan . |
| 7-263291 | 10/1995 | Japan . |
| 8-97389 | 4/1996 | Japan . |
| 28-077800 | 3/1998 | Japan . |
| 2901031 | 6/1999 | Japan . |
| 2910001 | 6/1999 | Japan . |
| 28-077800 | 9/1999 | Japan . |
| 2211991 | 7/1989 | United Kingdom . |
| WO 95/10718 | 4/1995 | WIPO . |
| WO 95/20824 | 8/1995 | WIPO . |
| WO 95/31825 | 11/1995 | WIPO . |
| WO 99/35674 | 7/1999 | WIPO . |

OTHER PUBLICATIONS

Choyke et al., "Implanted Hydrogen Effects at High Concentrations in Model Low Z Shielding Materials," *J. Nuc. Mtrls.*, 122–23:1585–86 (1984).

Choyke et al., "A Comparative Study of Near–Surface Effects Due to Very High Fluence H+ Implantation in Single Crystal FZ, CZ, and Web SI," *Mat. Res. Soc. Symp. Proc.*, 27:359–364 (1984).

Corbett et al., "Embrittlement of Materials: Si(H) as a Model System," *J. Nuc. Mtrls.*, 169:179–184 (1989).

Johnson et al., "Hydrogen–Induced Platelets in Silicon: Separation of Nucleation and Growth," *Mtrls. Sci. Forum*, 83–87:33–38 (1992).

Milnes et al., "Peeled Film Technology for solar Cells," pp. 338–341.

Oshima et al., "Defects in Si Irradiated with D–T Neutrons, D and He Ions," *J. Nuc. Mtrls.*, 179–181:947–950 (1991).

Bruel et al., "Smart Cut : A Promising New SOI Material Technology", Oct. 95, Proceedings 1995 IEEE International SOI Conference, pp. 178–179.

Alles, Michael et al., "Thin Film Silicon on Insulator: An Enabling Technology" *Semiconductor International*, pp. 67–72 (1997).

Basta, Nicholas, "Ion–Beam Implantation," *High Technology*, (1985).

Burggraff Peter, "Advanced Plasma Source: What's Working?" *Semiconductor International*, pp. 56–59.

Cassidy, Victor M., "Ion Implantation Process Toughens Metalworking Tools," *Modern Metals*, pp. 65–67 (1984).

Cheung, N.W., "Plasma Immersion Ion Implantation for Semiconductor Processing," *Material Chemistry and Physics*, vol. 46, Nos. 2–3, pp. 132–139 (Oct. 1996).

Chu, P.K. et al. "Plasma Immersion Ion Implantation—A Fledgling Technique for Semiconductor Processing," *Materials Science and Engineering Reports: A Review Journal*, vol. R17, Nos. 6–7, pp. 207–280 (Nov. 30, 1996).

Chu, Paul K. et al., "Recent Applications of Plasma Immersions Ion Implantation," *Semiconductor International*, pp. 165–172 (1996).

Chu, Paul K., "Synthesis of SOI Materials Using Plasma Immersion Ion Implantation," *1997 Mat. Res. Soc. Symp. Proc.*, vol. 438, pp. 333–343 (1997).

Hulett, D.M. et al., "Ion Nitriding and Ion Implantation: A Comparison," *Metal Progress*, pp. 18–21 (1985).

I.B.M. Technical Disclosure Bulletin, vol. 29: No. 3, p. 1416 (Aug. 1986).

Lee, B.H. et al., "A Novel Pattern Transfer Process for Bonded SOI Giga–bit DRAMS," *1996 IEEE Int'l. SOI Conference Proceedings, IEEE Electron Devices Society*, (1996).

Li. J., "Novel Semiconductor Substrate Formed by Hydrogen Ion Implantation into Silicon," *Appl. Phys. Lett.*, vol. 55: No. 21, pp. 2223–2224 (Nov. 20, 1989).

Lu, X. et al., "SOI Material Technology Using Plasma Immersion Ion Implantation," *Proceedings 1996 IEEE International SOI Conference* (Oct. 1996).

Matsuda et al., "Large Diameter Ion Beam Implantation System," *Nuclear Instruments and Methods*, vol. B21, pp. 314–316 (1987).

Moreau, Wayne M., "Semiconductor Lithography, Principles, Practices, and Materials," *Plenum Press* (1988).

*Patent Abstracts of Japan*, vol. 7, No. 107 (E–174), (May 11, 1993) JP–58–030145 (Feb. 22, 1983).

Picraux, S. Thomas et al., "Ion Implantation of Surfaces," *Scientific American*, vol. 252, No. 3, pp. 102–113 (1985).

Renier, M. et al., "A New Low–Energy Ion Implanter for Bombardment of Cylindrical Surfaces," *Vaccum*, vol. 35, No. 12, pp. 577–578 (1985).

Sioshansi, Piran, "Ion Beam Modification of Materials for Industry," *Thin Solid Film*, vol. 118, pp. 61–71 (1984).

Wolf, Stanley Ph.D., Silicon Processing for the VLSI Era vol. 2, pp. 66–79, Lattice Press (1990).

U.S. Dept of Energy, "The Fusion Connection . . . ", *Plasma Coating*, pp. 6–7 (1985).

Veldkamp, W.B. et al., Binary Optics, *Scientific American*, pp. 50–55 (May 1992).

Carter, G. et al., "The Collection of Ions Implanted in Semiconductors", *Radiation Effects*, Sep. 1972, vol. 16, No. 1–2, pp. 107–114. Abstract Only.

PRESSURIZED MICROBUBBLE THIN FILM SEPARATION PROCESS USING A REUSABLE SUBSTRATE

CROSS REFERENCE TO RELATED APPLICATIONS

This application claims priority from the provisional patent application entitled A CONTROLLED CLEAVAGE PROCESS AND RESULTING DEVICE, filed May 12, 1997 and assigned application Ser. No. 60/046,276, the disclosure of which is hereby incorporated in its entirety for all purposes. This application is being filed on the same date as related application Ser. No. 09/026,113 entitled "A CONTROLLED CLEAVAGE THIN FILM SEPARATION PROCESS USING A REUSABLE SUBSTRATE" and application Ser. No. 09/026,035 entitled "A REUSABLE SUBSTRATE FOR THIN FILM SEPARATION".

BACKGROUND OF THE INVENTION

The present invention relates to the manufacture of substrates. More particularly, the invention provides a technique for cleaving a thin film from a substrate that is reusable. The thin film can be used in the fabrication of a silicon-on-insulator substrate for semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Wafers for electronic device fabrication are often cut from an ingot, or boule, of material with an abrasive saw. The wafer often serves as both a mechanical substrate and a semiconductor material to form electronic devices in or on. One of the most common examples of this is cutting silicon wafers from a silicon ingot. The wafers are typically polished to a very fine surface finish after removing the mechanical damage left by the abrasive saw. In some processes, devices are fabricated directly in or on the silicon wafer. In other processes, a layer of semiconductor material is grown, for example by epitaxy, on the wafer. An epitaxial layer may provide lower impurity concentrations, or be of a different semiconductor type than the wafer. The devices are formed in what is known as the "active" layer, which is typically only a micron or so thick.

Sawing wafers from an ingot has several disadvantages. First, a significant amount of material may be lost due to the width, or kerf, of the saw blade. Second, the wafers must be cut thick enough to survive a typical circuit fabrication process. As the wafers get larger and larger, the required thickness to maintain sufficient strength to be compatible with given wafer handling methods increases. Third, the polishing process to remove the saw marks takes longer and removes yet more precious material than would be required if an alternative method existed.

The desire to conserve material lost to the sawing and polishing operations increases as the value of an ingot increases. Single-crystal silicon ingots are now being produced with diameters of twelve inches. Each wafer cut and polished from these ingots can cost over a thousand dollars. Ingots of other materials are also being produced. Some of these materials may be difficult to produce as a single crystal, or may require very rare and expensive starting materials, or consume a significant amount of energy to produce. Using such valuable material to provide simple mechanical support for the thin active layer is very undesirable, as is losing material to the sawing and polishing operations.

Several materials are processed by cleaving, rather than sawing. Examples include scribing and breaking a piece of glass, or cleaving a diamond with a chisel and mallet. A crack propagates through the material at the desired location to separate one portion of material from another. Cleaving is especially attractive to separate materials that are difficult to saw, for example, very hard materials. Although the cleaving techniques described above are satisfactory, for the most part, as applied to cutting diamonds or household glass, they have severe limitations in the fabrication of semiconductor substrates. For instance, the above techniques are often "rough" and cannot be used with great precision in fabrication of the thin layers desired for device fabrication, or the like.

From the above, it is seen that a technique for separating a thin film of material from a substrate which is cost effective and efficient is often desirable.

SUMMARY OF THE INVENTION

According to the present invention, a technique for removing thin films of material from a reusable substrate is provided. This technique separates thin films of material from a donor substrate by implanting gas-forming particles, such as hydrogen or rare gas ions, into the donor substrate, and then heat treating the substrate to form a layer of microbubbles that become pressurized and separate the thin film of material above a layer of microblisters. A second implant and separation process is then performed to remove multiple films from a single substrate.

In a specific embodiment, the present invention provides a process for forming a film of material from a donor substrate, which is reusable, using a pressurized microbubble process. That process includes a step of introducing gas-forming particles through a surface of a donor substrate to a selected depth underneath the surface, where the particles are at a sufficiently high concentration to form a region of microbubbles. A layer of material above the region of microbubbles is separated from the substrate by globally heating the substrate so that the microbubbles produce a pressure effect.

The present invention separates several thins films of material from a single, reusable donor substrate. The thin films can be used for fabrication of, for example, a silicon-on-insulator or silicon-on-silicon wafer. A planarizing layer of silicon oxide may be formed on the donor substrate after each cleaving step to facilitate bonding the donor wafer to a transfer wafer, or stiffener. Accordingly, the present invention provides a reusable substrate, thereby saving costs and reduces the amount of scrap material.

The present invention achieves these benefits and others in the context of known process technology. However, a further understanding of the nature and advantages of the present invention may be realized by reference to the latter portions of the specification and attached drawings.

DESCRIPTION OF SPECIFIC EMBODIMENTS

The present invention provides a technique for removing a thin film of material from a substrate while preventing a possibility of damage to the thin material film and/or a remaining portion of the substrate. The thin film of material is attached to a stiffener, such as a silicon dioxide wafer or silicon wafer. The thin film of material can also be used for a variety of other applications. The invention will be better understood by reference to the Figs. and the descriptions below.

1. A Pressurized Microbubble Separation Process

FIGS. 1–4 are simplified cross sections of thin film of material being separated from a wafer according to a wafer bonding process. A wafer bonding process involving an implantation blister method, such as a process known as "Smart Cut," is described. An example of an implantation blister method is described in U.S. Pat. No. 5,374,564, entitled *Process For The Production Of Thin Semiconductor Material Films*, by Michel Bruel, issued Dec. 20, 1994.

Figure 1:
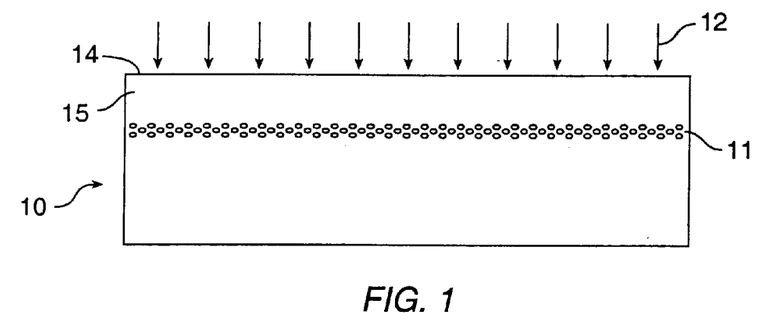
FIGS. 1–3 are simplified diagrams illustrating a thin film separation technique according to an embodiment of the present invention.

FIG. 1 shows a monocrystalline donor wafer 10 with a blister layer 11. The blister layer was formed by implanting 12 hydrogen into the donor wafer, which is oriented such that a crystalline plane, or cleavage plane, is approximately parallel to the blister layer. For example, a dose of about $10^6$ $cm^{-2}$ hydrogen ions implanted into a {100} silicon wafer at 150 KeV formed a blister layer approximately 1.2 $\mu$m below the top surface 14 of the donor wafer 10. It is believed that the implanted hydrogen ions capture electrons to form hydrogen atoms, which in turn form diatomic hydrogen gas. The hydrogen gas starts to form a layer of bubbles in the blister layer, which is parallel to a cleaving plane of the donor wafer. When the wafer is heated, gas pressure builds within the blister layer, and a thin layer of the donor wafer will split off along the cleavage plane. The donor wafer may include a thin layer of silicon oxide (not shown) on its top surface to encapsulate the silicon and to assist in a subsequent wafer bonding process. The hydrogen may be implanted through this layer of oxide.

While gases other than hydrogen may be used, such as helium, neon, krypton, and xenon, hydrogen is advantageous. The braking process of hydrogen ions in silicon is an electronic, rather than nuclear, phenomena. This allows for a relatively high dosage to be implanted with relatively little damage to the silicon lattice, as compared to implanting similar doses of heavier ions. The electronic braking also provides a smaller range of distribution of implanted ions than would typically be obtained when implanting a heavier ion. This makes it possible to obtain suitable blister formation at a moderate implanted dose, and to separate a layer of silicon with a relatively smooth surface.

The thickness of the thin layer may be determined by appropriately choosing the implant energy. The expected thickness for {100} silicon has been calculated using the public-domain "TRIM" modeling software developed by J. Zeigler, as shown in Table 1.

TABLE 1

| ENERGY (KeV) | 10 | 50 | 100 | 150 | 200 | 590 | 1000 |
|---|---|---|---|---|---|---|---|
| Film Thickness ($\mu$m) | 0.14 | 0.5 | 0.88 | 1.27 | 1.72 | 5.59 | 15.67 |

Figure 2:
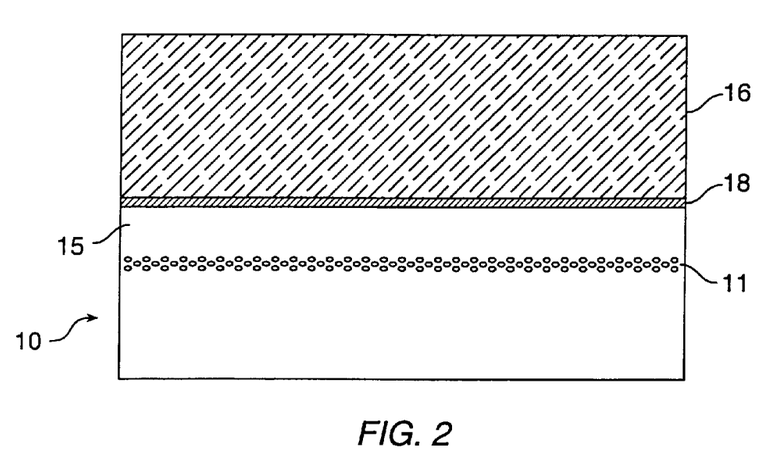

FIG. 2 shows a backing substrate 16 bonded to the donor wafer 10. The backing substrate provides support to a thin film 15 of silicon that will be blistered off of the donor wafer. The backing substrate 16 also provides a layer of insulation 18 underneath the thin layer of silicon, such as a layer of dielectric material or insulating adhesive on the backing substrate, or the entire backing substrate may be insulating, such as if it were made of fused silica or glass. The backing substrate may be any of a variety of materials, but a silicon wafer with a layer of thermally grown oxide provides a desirable backing substrate for use with a thin layer of silicon because of the substrate's thermal expansion coefficient and bonding properties. The donor wafer may be bonded to the backing substrate by a variety of methods, including applying an electrostatic voltage across the layer of thermally grown oxide on the backing substrate. For example, if the thermally grown oxide layer is 5,000 Å thick, then applying several dozen volts across the dielectric layer or layers, produces pressures in the range of one million Pascals between the donor wafer and the backing substrate. Appropriately heat treating the wafer assembly causes the hydrogen gas to coalesce into a blister, separating the top 1.2 $\mu$m of silicon (thin film 16) from the donor wafer.

Figure 3:
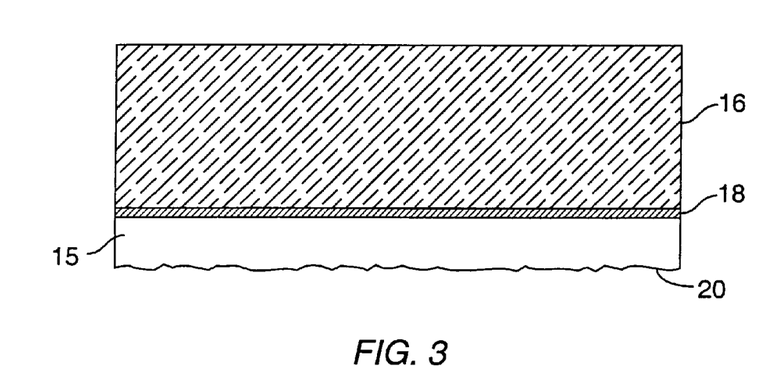

FIG. 3 shows the thin film of silicon 15 separated from the donor wafer (not shown) and bonded to the backing substrate 14. The cleaved surface 20 of the thin film 15 is relatively rough, typically having a surface roughness of about 100 nm RMS.

2. Silicon-On-Insulator Process

A process for fabricating a silicon-on-insulator substrate according to the present invention may be briefly outlined as follows:

(1) Provide a donor silicon wafer (which may be coated with a dielectric material);

(2) Introduce gas-forming particles into the silicon wafer to a selected depth to create a layer of microbubbles;

(3) Provide a target substrate material (which may be coated with a dielectric material);

(4) Bond the donor silicon wafer to the target substrate material by joining the implanted face to the target substrate material;

(5) Heat the substrate to create a pressure effect in the microbubbles to separate a thin film of material from the donor wafer;

(6) Complete bonding of donor silicon wafer to the target substrate (optional); and (7) Polish a surface of the thickness of silicon film (optional).

Figure 4:
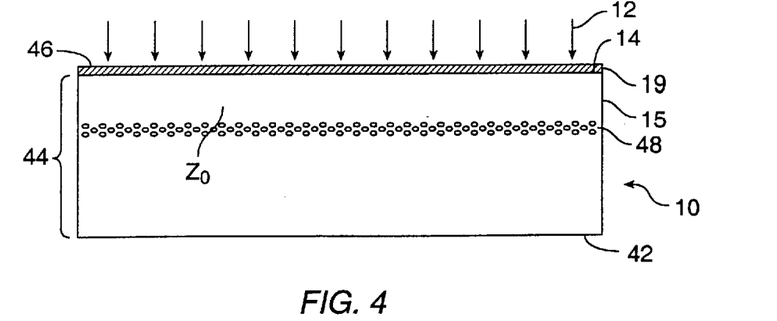
FIGS. 4–10 are simplified cross-sectional view diagrams illustrating a method of forming a silicon-on-insulator substrate according to the present invention.

FIGS. 4–10 are simplified cross-sectional view diagrams of substrates undergoing a fabrication process for a silicon-on-insulator wafer according to the present invention. The process begins by providing a semiconductor substrate 10, as shown by FIG. 4. Substrate, or donor wafer, 10 includes a material region 15 to be removed, which is a thin relatively uniform film derived from the substrate material. The silicon wafer includes a top surface 14, a bottom surface 42, and a thickness 44. Material region also includes a thickness ($z_0$), within the thickness 44 of the silicon wafer. Optionally, a dielectric layer 19 (e.g., silicon nitride, silicon oxide, silicon oxynitride) overlies the top surface of the substrate 14. The present process provides a technique for removing the material region 15 using the following sequence of steps for the fabrication of a silicon-on-insulator wafer.

Selected gas-forming particles 12 implant through the surface 46 of the optional dielectric layer 19 to a selected depth, which defines the thickness of the material region, termed the thin film of material. As shown, the particles have a desired concentration 48 at the selected depth ($z_0$). A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. Maintaining the crystalline nature of the donor substrate is important for many device fabrication processes, which have been developed on single-crystal wafers. A hydrogen ion, or proton, is one type of small mass particle that is desirable, as is a helium ion, or alpha particle. While helium ions are generally generated from helium gas, hydrogen ions may be generated from a variety of sources, including water vapor and methane. Various isotopes or combination of isotopes can be used.

Figure 5:
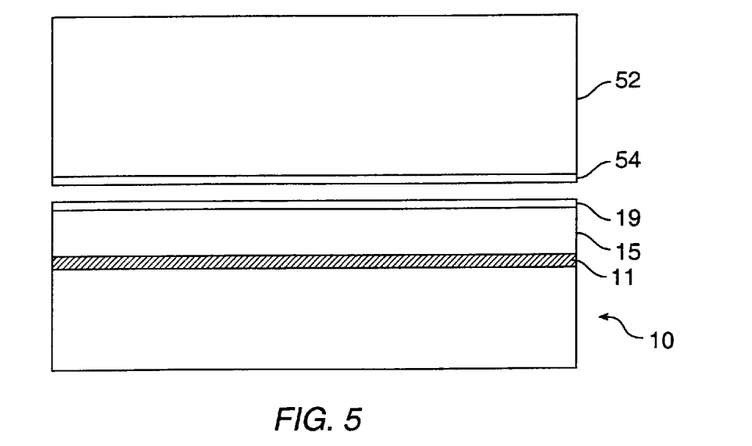

The process uses a step of joining the implanted silicon wafer 10 to a workpiece, or target wafer, 52 is illustrated in FIG. 5. The workpiece 52 may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the microbubbles do not exert excessive pressure on the material region, which can cause the region to separate from the substrate. In one aspect, the low temperature bonding process occurs by a self-bonding process. In particular, one wafer is stripped to remove oxidation therefrom (or one wafer is not oxidized). A cleaning solution treats the surface of the wafer to form O-H bonds on the wafer surface. An example of a solution used to clean the wafer is a mixture of $H_2O_{2\text{-}H2}SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface is placed against a face of the other wafer, which has a coat of oxidation thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass ("SOG") layers can be used to bond one wafer surface onto the face of another. These SOG materials include, among others, siloxanes or silicates, which are often mixed with alcohol-based solvents or the like. SOG can be a desirable material because of the low temperatures (e.g., 150 to 250° C.) often needed to cure the SOG after it is applied to surfaces of the wafers.

Alternatively, a variety of other low temperature techniques can be used to join the donor wafer to the target wafer. For instance, an electrostatic bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 6:
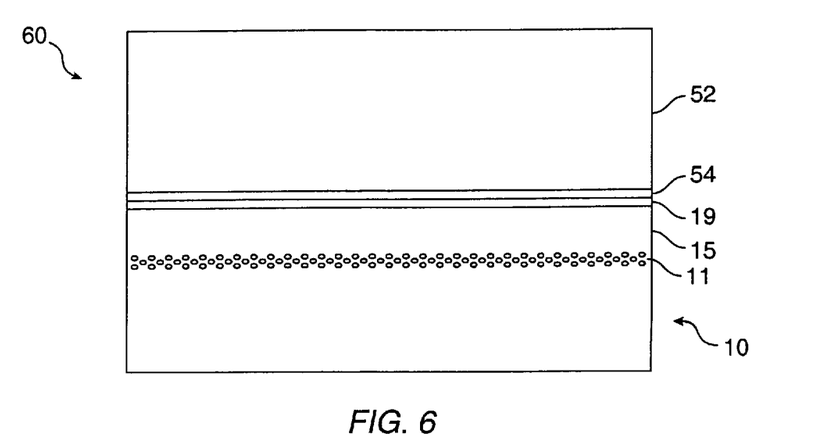

After bonding the wafers into a sandwiched structure 60, as shown in FIG. 6, the method includes a thermal treatment to pressurize the microbubbles 11 and separate a thin film of material 15 from the substrate. In a preferred embodiment, the method maintains a temperature which is higher than a temperature of introducing the particles into the substrate. In some embodiments, the substrate temperature is maintained between at 500° C. or above.

Figures 7, 8:
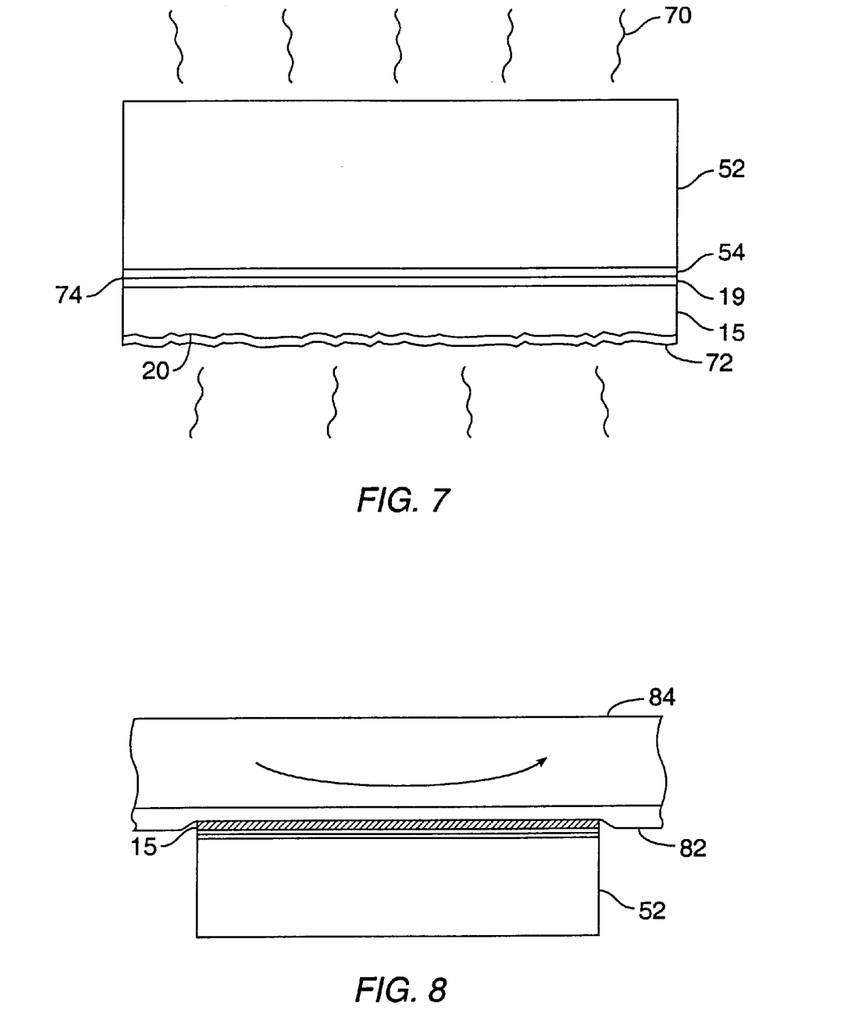

A final bonding step occurs between the target wafer and thin film of material region according to some embodiments, as illustrated by FIG. 7. In one embodiment, one silicon wafer has an overlying layer of silicon dioxide 72, which is thermally grown overlying the cleaved surface 20 before cleaning the thin film of material. The silicon dioxide can also be formed using a variety of other techniques, e.g., chemical vapor deposition.

In some embodiments, the oxidized silicon surface from either the target wafer or the thin film of material region (from the donor wafer) are further pressed together and are subjected to an oxidizing ambient 70. The oxidizing ambient can be in a diffusion furnace for steam oxidation, hydrogen oxidation, or the like. A combination of the pressure and the oxidizing ambient fuses the two silicon wafers together at the oxide surface or interface 74. These embodiments often require high temperatures (e.g., 700° C.).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

After bonding the wafers, silicon-on-insulator has a target substrate with an overlying film of silicon material and a sandwiched oxide layer between the target substrate and the silicon film, as also illustrated in FIG. 7 The detached surface 20 of the film of silicon material is often rough and needs finishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Alternatively, chemical mechanical polishing or planarization ("CMP") techniques finish the detached surface of the film, as illustrated by FIG. 8. In CMP, a slurry mixture is applied directly to a polishing surface 82 which is attached to a rotating platen 84. This slurry mixture can be transferred to the polishing surface by way of an orifice, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

Figure 9:
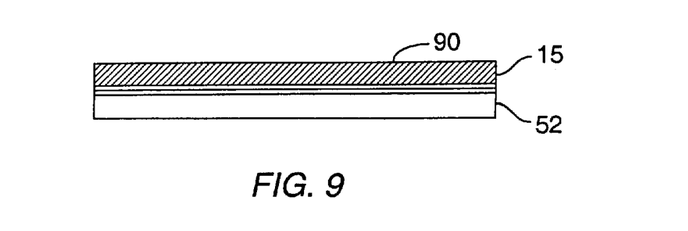

This acid solution generally interacts with the silicon material from the wafer during the polishing process. The polishing process preferably uses a poly-urethane polishing pad. An example of this polishing pad is one made by Rodel and sold under the tradename of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface 90 for subsequent processing, as illustrated by FIG. 9.

In certain embodiments, a thin film of oxide 72 overlies the film of material overlying the target wafer, as illustrated in FIG. 7. The oxide layer forms during the thermal annealing step, which is described above, for permanently bonding the film of material to the target wafer. In these embodiments, the finishing process is selectively adjusted to first remove oxide and the film is subsequently polished to complete the process. Of course, the sequence of steps depends upon the particular application.

Figure 10:
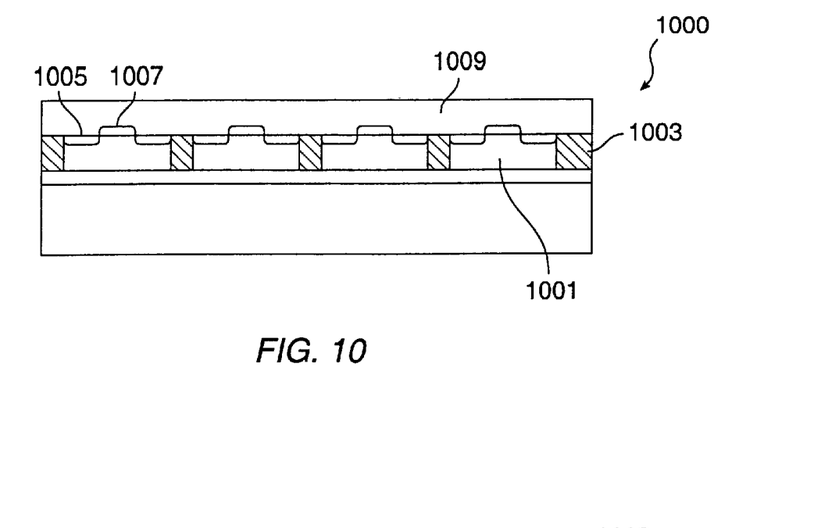

In a specific embodiment, the silicon-on-insulator substrate undergoes a series of process steps for formation of integrated circuits thereon. These processing steps are described in S. Wolf, Silicon Processing for the VLSI Era (Volume 2), Lattice Press (1990), which is hereby incorporated by reference for all purposes. A portion of a completed wafer 1000 including integrated circuit devices is illustrated by FIG. 10. As shown, the portion of the wafer 1000 includes active devices regions 1001 and isolation regions 1003. The active devices are field effect transistors each having a source/drain region 1005 and a gate electrode 1007. A dielectric isolation layer 1009 is defined overlying the active devices to isolate the active devices from any overlying layers.

3. A Process For Reusing A Donor Substrate

Additional films may be separated from the donor substrate. For some applications, the surface of the donor substrate does not need preparation after a thin film has been separated and before subsequent implantation and separation steps occur. In other applications, it is beneficial to prepare the surface of the donor substrate prior to repeating the separation sequence. For example, pulled silicon crystals are known to contain vacancy-related defects (e.g. COP defects). These defects at the surface region of the wafers can be removed by applying an annealing step at 1200° C. for a several seconds. Such a surface treatment generally improves the crystalline quality of the silicon surface.

Figure 11:
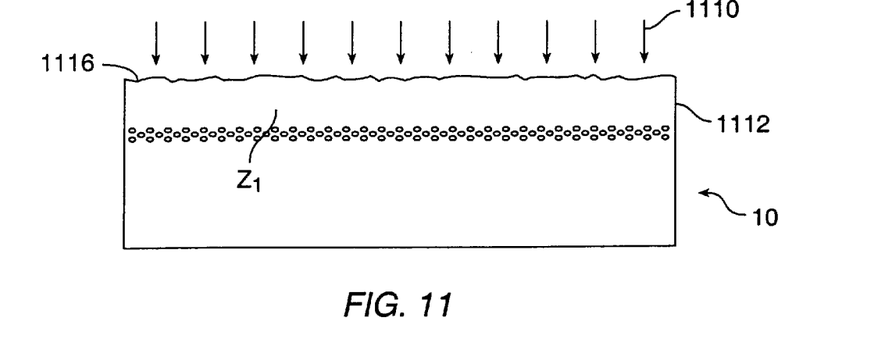
FIGS. 11–14 are simplified diagrams illustrating a method of separating a second layer of material from a single substrate.

FIGS. 11 to 14 illustrate using a single donor substrate to produce multiple thin films. FIG. 11 shows the donor substrate 10 after a first thin film of material (not shown) has been removed, as described above, to produce a separated surface 1116. A second implant of gas-forming particles 1110 has a desired concentration at a second selected depth $z_1$ to form a second material region 1112 to be removed. The second material region may be removed as a thin film following a process as described above, as well as others.

Figure 12:
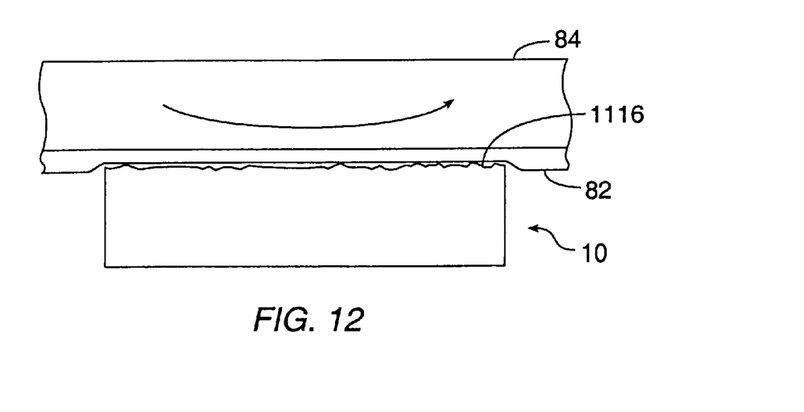

FIG. 12 shows the donor substrate 10 being polished to improve the surface finish of a separated surface 1116 prior to separating a second thin film of material from the donor substrate. The polishing operation is similar to that described above for polishing a surface of a separated film, and is generally done before the second implanting step.

Figure 13:
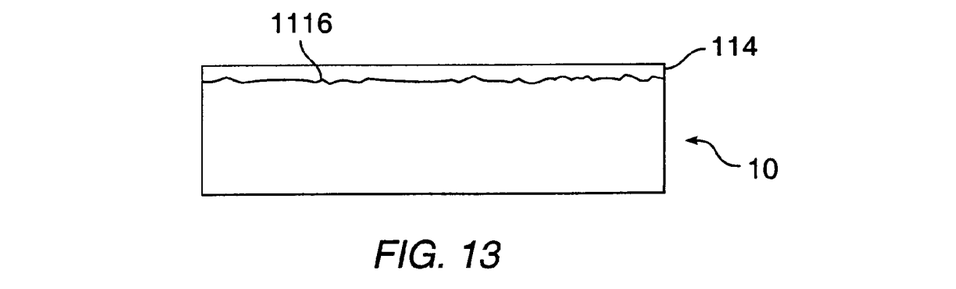

FIG. 13 shows the donor substrate 10 after a planarizing layer 114 has been applied to the separated surface 1116. The planarizing layer may be a layer of plasma-etched deposited oxide, for example, spin-on glass, polyimide, or similar material. Preparing the surface of the donor substrate with a planarized layer of oxide or polymer prior to cleaving a subsequent thin film is desirable in some applications, especially when using a transfer wafer or backing substrate. It is not necessary to polish the donor wafer prior to implantation, and the planarized surface of the deposited oxide or other materials provides a surface for bonding the donor wafer to a transfer wafer by planarizing the minor surface imperfections of the separated surface of the donor wafer. Planarizing the donor wafer in this fashion allows a donor substrate to be re-used within a clean room environment, rather than sending the donor substrate out to be polished after each thin film has been separated.

For example, one process according to the present invention for fabricating multiple thin films from a single donor wafer using a wafer bonding technique is described below:

(1) Provide a donor wafer;

(2) Implant gas-forming particles into the wafer to form a first layer of microbubbles that define a thin film region between a surface of the wafer and the microbubbles;

(3) Bond the surface of the donor wafer to a first transfer wafer;

(4) Thermally treat the substrate to separate the first thin film from the donor substrate, where the first thin film adheres to the second transfer wafer;

(5) Deposit a planarized layer of silicon oxide on a separated surface of the donor wafer. Optionally, a layer of thermal oxide may be grown prior to the deposition and/or the donor wafer may be thermally treated to improve the surface of the silicon;

(6) Implant additional gas-forming particles into the wafer to form a second layer of microbubbles to define a second thin film region between the surface of the oxide layer and the microbubbles;

(7) Bond the surface of the donor wafer to a second transfer wafer; and (8) Thermally treat the substrate to separate a second thin film from the donor substrate, the second thin film adhering to the second transfer wafer.

Figure 14:
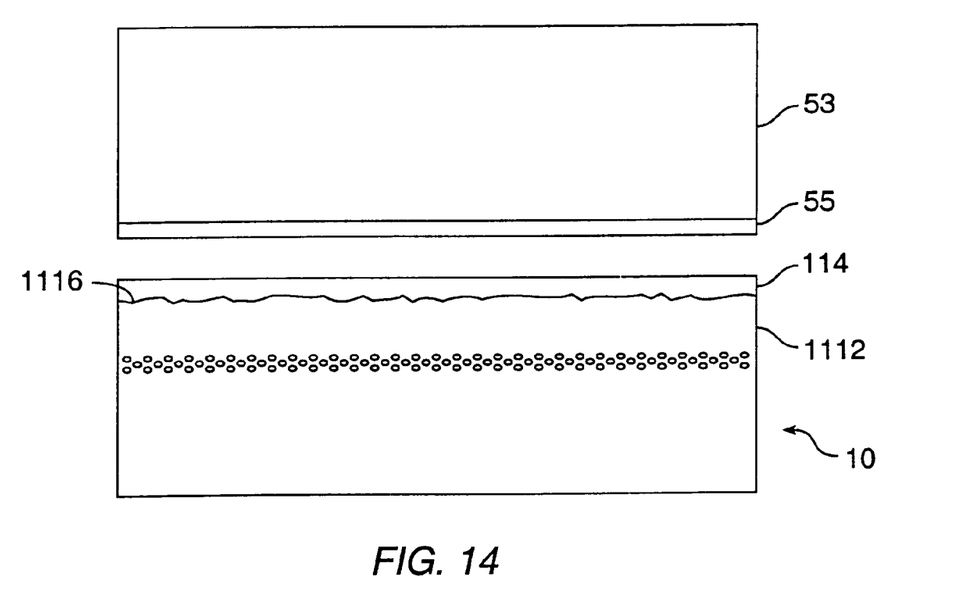

As an alternative or in addition to step (5), the surface of the donor substrate could be polished prior to the subsequent thin film separation sequence. FIG. 14 is a simplified cross section of a substrate 10 that with a second region of material 1112 to be separated from the substrate. A planarizing layer 114 has been applied to the separated surface 1116 to prepare it for bonding to the target wafer 53. The planarizing layer provides a good surface for a wafer bonding process, as described above.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A process for forming films of material from a substrate, said process comprising steps of:
    introducing first gas-forming particles through a surface of the substrate to a first selected depth beyond said surface, said first gas-forming particles forming a layer of microbubbles to define a first layer of substrate material to be removed between about said first selected depth and said surface, and to define a first remaining portion of substrate material;
    connecting the surface to a first stiffener to form a first assembly,
    heating said first assembly to free said first layer of substrate material from the substrate to form a separated surface on said substrate, said surface having microblister damage;
    planarizing said microblister damaged separated surface with a layer of silicon oxide;
    introducing second gas-forming particles through said separated surface of said substrate to a second selected depth beyond said separated surface, said second gas-forming particles forming a second layer of microbubbles to define a second layer of substrate material to be removed between about said second selected depth and said separated surface, and to define a second remaining portion of substrate material;
    connecting the separated surface to a second stiffener to form a second assembly; and
    heating said second assembly to free said second layer of substrate material from the substrate.

2. The process of claim 1 wherein said second gas-forming particles are hydrogen ions.

3. The process of claim 1 wherein said second gas-forming particles are helium ions.

4. The process of claim 1 wherein said oxidized surface is prepared by polishing.

5. The process of claim 4 wherein said polishing comprises a chemical-mechanical polishing process.

6. The process of claim 1 wherein said substrate comprises single-crystal silicon with a principal crystallographic plane substantially parallel to the surface.

7. The process of claim 6 wherein said principal crystallographic plane is a {100} plane.

8. The process of claim 1 wherein said step of introducing first gas-forming particles includes plasma immersion ion implantation.

9. A process for forming films of material from a reusable silicon wafer, the silicon wafer having a {100} crystallographic plane substantially parallel to a surface of the silicon wafer, said process comprising steps of:
    introducing first gas-forming particles trough the surface of the silicon wafer to a first selected depth underneath said surface, said first gas-forming particles forming a layer of microbubbles to define a first layer of silicon material to be removed above said first selected depth and to define a first remaining portion of wafer material below said first selected depth;
    connecting the surface to a first stiffener to form a first assembly;
    heating said first assembly to free said first layer of silicon material from the silicon wafer to form a separated surface on said silicon wafer, said separated surface having microblister damage;
    forming a bonding layer on the separated surface, including providing a silicon oxide layer to planarize sad microblister damaged separated surface;
    introducing second gas-forming particles through said separated surface of said silicon wafer to a second selected depth underneath said separated surface, said second gas-forming particles forming a second layer of microbubbles to define a second layer of silicon material to be removed above said second selected depth and to define a second remaining portion of silicon material below said second selected depth; and
    connecting the bonding layer to a second stiffener to form a second assembly; and heating said second assembly to free said second layer of silicon material from the silicon wafer.

10. The method of claim 9 wherein the bonding layer is formed on the separated surface prior to the step of introducing the second gas-forming particles.

* * * * *